United States Patent [19]

Kimura et al.

[11] 4,320,965
[45] Mar. 23, 1982

[54] AUTOMATIC MASKING DEVICE FOR USE IN A PRINTER

[75] Inventors: Yoshikazu Kimura, Kusatsu; Kenziro Tanabe; Hiroyuki Yonehara, both of Hikone, all of Japan

[73] Assignee: Dainippon Screen Seizo Kabushiki Kaisha, Kyoto, Japan

[21] Appl. No.: 128,179

[22] Filed: Mar. 7, 1980

[30] Foreign Application Priority Data

Mar. 19, 1979 [JP] Japan .................................. 54-32085

[51] Int. Cl.³ ............................................. G03B 27/58
[52] U.S. Cl. .................................................... 355/74
[58] Field of Search ......................... 355/74, 71, 55, 64

[56] References Cited

U.S. PATENT DOCUMENTS 3,732,010 5/1973 Harter et al. ......................... 355/74

Primary Examiner—Richard A. Wintercorn
Attorney, Agent, or Firm—Michael A. Painter

[57] ABSTRACT

An automatic masking device for use in a printer, wherein a reproduction picture to be projected onto a photosensitive film sheet mounted on a holder is masked by a pair of masking plates which are separated at a certain distance away from the surface of the photosensitive film sheet, and are adapted to be movable over the surface of the film sheet so as to open and close the opening distance between the masking plates, and wherein the opening distance between the masking plates is settled by moving the masking plates depending on an magnification and a size of the reproduction picture.

7 Claims, 3 Drawing Figures

AUTOMATIC MASKING DEVICE FOR USE IN A PRINTER

BACKGROUND OF THE INVENTION

This invention relates to an automatic masking device for use in a printer in which an original picture is projected through a focusing lens onto a photosensitive material such as a film, a plate, or the like, mounted on a photosensitive material holder.

When a plurality of original pictures are printed one by one onto a photosensitive film according to the desired rayout by using a grouping camera or a projector, one picture is exposed, while the surface of the photosensitive film except the corresponding portion to the one picture is masked by a masking device.

When the masking is carried out, masking plates are preferably contacted with the photosensitive film. However, in a conventional masking device, the masking plates are separated from the film so as not to damage the surface of the film. Accordingly, in this case, when the angle of view is large, a considerable error between the opening distance between the masking plates and the size of the picture reproduction projected is resulted, unlike the contact printing process.

The rayout of the reproduction pictures onto the photosensitive film by the grouping camera requires the precise size of each reproduction picture. When the conventional masking device is used for such a rayout process, a white or a dark line is often appeared between the two reproduction pictures due to an overlap or a gap between the two reproduction pictures, and imparts the fatal damage to the quality of the finished product, particularly in case of a color duplicate film.

SUMMARY OF THE INVENTION

Therefore, it is an object of the present invention to provide an automatic masking device for use in a printer free from the abovementioned defects, which is simple and reliable in operation.

According to the present invention there is provided an automatic masking device for use in a printer, comprising a photosensitive film sheet holder on which a photosensitive film sheet is to be held; and a pair of masking plates which are separated at a certain distance away from the surface of the holder, and are adapted to be movable over the surface of the holder so as to open and close the opening distance between the masking plates, characterized in that the opening distance between the masking plates is settled by moving the masking plates depending on a magnification and a size of a reproduction picture to be projected onto the photosensitive film sheet on the holder.

BRIEF DESCRIPTION OF DRAWINGS

In order that the present invention may be better understood, a preferred embodiment thereof will now be described with reference to the accompanying drawings, in which.

DESCRIPTION OF A PREFERRED EMBODIMENT

Figure 1:
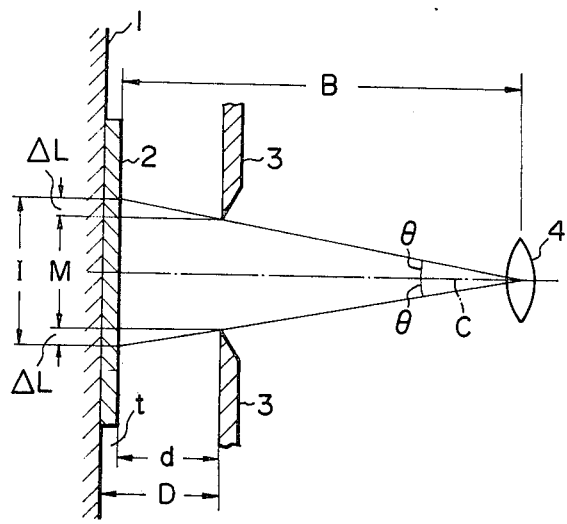
FIG. 1 is a schematic longitudinal cross-section of an optical system of a printer and an automatic masking device according to the present invention, for explaining the principle of the present invention.

Referring now to the drawings, there is shown in FIG. 1 a vertical support plate 1 on which a photosensitive material such as a photosensitive film 2 having a thickness t is secured properly, for example, by means of a vacuum suction means, or the like.

In front of the photosensitive film 2, a pair of masking plates 3 are arranged at a distance D or d away from the surface of the vertical support plate 1 or the photosensitive film 2, and are movable vertically toward or away from each other over the surface of the vertical plate 1.

A convex focusing lens 4 having a focal distance f of a printer for plate-making, or the like, is arranged before the masking plates 3 at a distance B away from the surface of the photosensitive film 2 along a central light axis C which passes through the center of the vertical support plate 1. An original picture (not shown) is projected onto the photosensitive film 2 through the lens 4 and the aperture between the masking plates 3, and the angle of view with respect to the lens 4 is $2\theta$.

Assuming that the opening distance between the masking plates 3 is M, the size of the reproduction picture to be projected on the photosensitive film 2 is I, and the difference between the size I of the reproduction picture and the opening distance M is $2\Delta L$, thus I equals M and $2\Delta L$. If the magnification of the reproduction picture to be projected is m, the following formulae are resulted.

$$M = I - 2\Delta L \tag{1}$$

$$\Delta L = d \tan \theta \tag{2}$$

$$d = D - t \tag{3}$$

$$\tan \theta = I/2B \tag{4}$$

$$B = f(1+m) \tag{5}$$

From these formulae the relation between I and M is expressed in the following formula.

$$M = I[1 - D - t/f(1+m)] \tag{6}$$

Now, if two pairs of vertical and horizontal masking plates constitute a rectangular opening, and horizontal and vertical opening distances to be obtained between the masking plates, horizontal and vertical sizes of the reproduction picture projected on the film, and the distances between the vertical support plate and the vertical and the horizontal masking plates are Mx, My, Ix, Iy, Dx and Dy, the formula (6) is expressed in the two following formulae.

$$Mx = Ix[1 - Dx - t/f(1+m)] \tag{6-1}$$

$$My = Iy[1 - Dy - t/f(1+m)] \tag{6-2}$$

In the formulae (6-1) and (6-2), since Dx, Dy, t, f and m are known from the construction of the masking device and the photosensitive material, the horizontal and the vertical opening distances Mx and My to be obtained may be readily determined.

From the formulae (1)–(5), the opening distance M is shown in the following formulae, $$M = I - 2d \tan \theta \quad (7)$$

$$M = I - dI/B \quad (8)$$

wherein d, θ and B can be measured, and thus the opening distance desired between the masking plates corresponding to the size of the reproduction picture to be projected may be determined according to these formulae (7) and (8).

According to the present invention, the opening distances Mx and My between the vertical and the horizontal masking plates are determined by the formulae described above, and then depending on these Mx and My, the positions of the masking plates are controlled automatically so that the masking plates may be opened properly into the desired distances.

Figure 3:
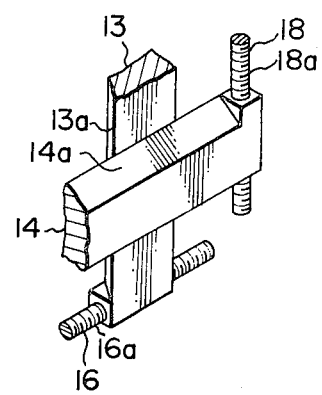
FIG. 3 is a fragmentary perspective view of masking plates in the device in FIG. 2.
Figure 2:
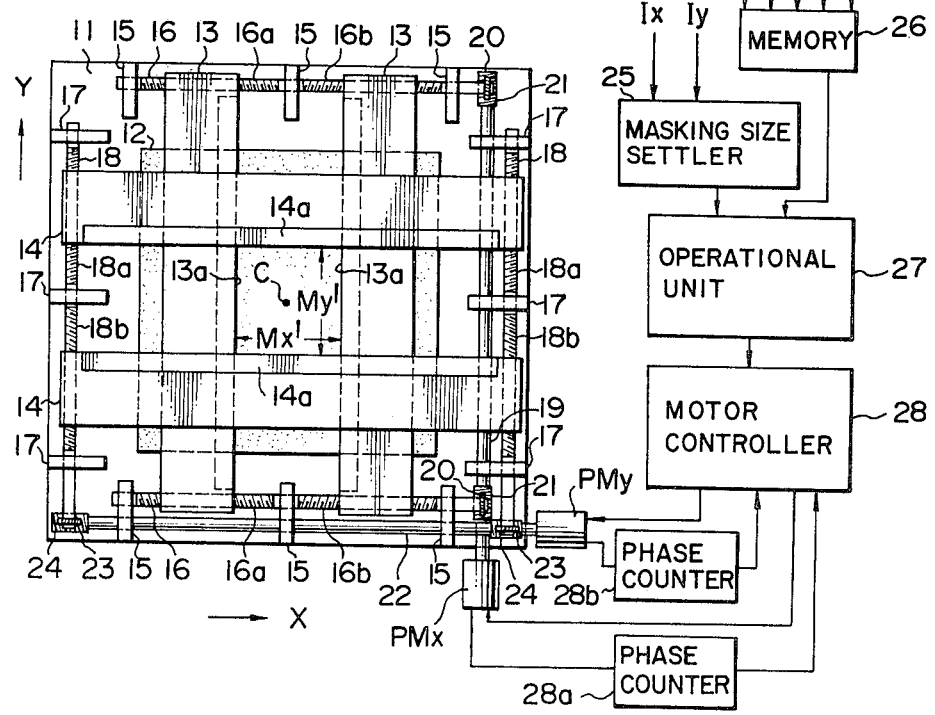
FIG. 2 is a schematic elevation view of an automatic masking device together with a diagram of an electric control circuit thereof according to the present invention.

In FIGS. 2 and 3 there is shown an automatic masking device according to the present invention.

On a vertical support plate 11, a photosensitive film material 12 having a thickness t is sucured properly. Two pairs of vertical and horizontal masking plates 13 and 14 are movably mounted to upper, lower, left and right screw rods 16 and 18 which are rotatably mounted to upper, lower, left and right edges of the vertical plate 11 via bearing members 15 and 17. Each screw rod 16 or 18 includes a normal and reverse screw portions in its left and right or upper and lower half parts 16a and 16b or 18a and 18b in FIG. 2, which the tapped ends of the masking plates 13 or 14 are engaged with. Thus, each pair of masking plates 13 or 14 may be moved toward or away from the central light axis C each other in X or Y direction in FIG. 2 by driving the screw rods 16 or 18.

As clearly shown in FIG. 3, each vertical or horizontal masking plate 13 or 14 is provided with a knife-edge 13a or 14a in its rear or front inside surface, and the front surfaces of the vertical masking plates 13 are contacted with the rear surfaces of the horizontal masking plates 14.

Therefore, the distances Dx and Dy from the surface of the vertical plate 11 to the vertical and the horizontal masking plates 13 and 14 are substantially the same [refer to the formulae (6-1) and (6-2)], and thus the resolving powers of the vertical and the horizontal edges of the reproduction picture projected on the photosensitive film 12 are substantially the same. Further, the flare which is caused, if no knife-edges are provided to the masking plates, by the reflected lights from inner side edges of the masking plates is removed.

A coupling rod 19 is rotatably mounted to the bearing members 17 in parallel with the screw rod 18 positioned in the right hand side of the vertical plate 11 in FIG. 2. A pair of worm wheels 20 are connected to one ends, the right hand side ends in FIG. 2, of the screw rods 16, and a pair of worms 21 are fixed to the upper and the lower ends of the coupling rod 19 so that the worm wheels 21 and the worms 21 may be engaged with one another. The coupling rod 19 is driven by a pulse motor PMx connected to its lower end, which is capable of rotating the coupling rod 19 clockwise and counterclockwise, and whose rotation number and phase can be detected.

Another coupling rod 22 is rotatably mounted to the bearing members 15 in parallel with the screw rod 16 positioned in the bottom of the vertical plate 11 in FIG. 2. A pair of worm wheels 23 are mounted to the lower ends of the screw rods 18 and a pair of worms 24 are connected to both ends of the coupling rod 22 so that the worm wheels 23 and the worms 24 may be engaged with one another. The coupling rod 22 is driven by another pulse motor PMy of the same type as the one PMx, which is connected to its right hand side end.

Hence, it is readily understood that each pair of masking plates 13 or 14 may be moved toward or away from each other by controlling the pulse motor PMx or PMy, thereby adjusting the horizontal and the vertical real opening distances Mx' and My' between the masking plates, as shown in FIG. 2.

A masking size settler 25 having an adjusting dial or slide lever sets up the horizontal and the vertical sizes Ix and Iy of the reproduction picture to be projected onto the photosensitive material 12. In a memory 26 the values Dx, Dy (in this embodiment, Dx equals Dy), t, f and m appeared in the formulae (6-1) and (6-2), and so forth, are stored in advance.

The magnification m is often varied when the original pictures are varied one by one. Thus, it may be set to the desired value by a dial in the similar manner to the masking size settler 25 and the value set may be stored in the memory 26 or be sent directly to a following operational unit 27. The operational unit 27 operates the values Ix, Iy, Dx, Dy, t, f, and m fed from the masking size settler 25 and the memory 26 according to the formulae (6-1) and (6-2) to obtain the horizontal and the vertical opening distances Mx and My corresponding to the values Ix and Iy, and outputs signals to a motor controller 28.

The motor controller 28 controls the pulse motors PMx and PMy depending on the output signals from the operational unit 27 so that the real opening distances Mx' and My' may be coincident with the values Mx and My operated in the operational unit 27.

While the pulse motors PMx and PMy are controlled by the motor controller 28, the pulse motors PMx and PMy output pulse signals corresponding to the rotation numbers and the phases of the motors to phase counters 28a and 28b which output signals corresponding to the rotation numbers and the phases of the pulse motors to the motor controller 28 in order to detect the precise positions of the masking plates 13 and 14 from the standard point.

When the real opening distances Mx' and My' are coincident with the operated values Mx and My, the pulse motors PMx and PMy are stopped automatically, thereby setting the opening distances between the vertical and the horizontal masking plates to the desired values operated in the operational unit.

According to the present invention the photosensitive material 12 may be of course movable over the surface of the vertical plate 11 by a proper moving means.

One of each or both vertical or/and horizontal masking plates may be omitted, as occasion demands, in order to determine the size of the reproduction picture exactly.

Further, three or more pairs of masking plates may be so arranged as to be movable independently as described above.

According to the present invention, induction motors may be used instead of the pulse motors, and rotary encoders may be utilized instead of the coupling rods 19 and 22.

Although the present invention has been described in terms of a preferred embodiment thereof, however, various changes and modifications may be made by those skilled in the art without departing from the scope of the present invention.

We claim:

1. An automatic masking device for use in a printer, comprising:
   (a) a photosensitive film sheet holder on which a photosensitive film sheet is to be held; and
   (b) a pair of masking plates which are separated at a certain distance away from the surface of the holder, and are adapted to be movable over the surface of the holder so as to open and close the opening distance between the masking plates, the opening distance between said masking plates being a function of the size of a reproduction picture to be projected onto the photosensitive film sheet on the holder, the magnification of the projected picture reproduction and the distance between said masking plates and said photosensitive film sheet holder.

2. A device as defined in claim 1 further comprising an operation unit which operates the opening distance M between the masking plates according to the following formula, $M = I[1 - D - t/f(1+m)]$ wherein I, D, t, f and m are the size of the reproduction picture to be projected, a distance between the holder and the masking plates, a thickness of the photosensitive film sheet, a focal distance of a lens in the printer, and the magnification of the reproduction pictures, respectively.

3. A device as defined in claim 2, further comprising a memory in which the values D, t, f and m are stored.

4. A device as defined in claim 3 further comprising a controller which controls the masking plates so that the opening distance between the masking plates may be coincident with the distance M operated in the operational unit.

5. A device as defined in claim 4 wherein each masking plate is provided with a knife-edge in its inside end.

6. A device as defined in claim 5 wherein the masking plates are moved by a pulse motor to be controlled by the controller.

7. A device as defined in any of claims 1, 2, 3, 4, 5 or 6 wherein two pairs of masking plates are so arranged that one pair of masking plates may be movable toward or away from each other in one direction, and the other pair of masking plates may be movable toward or away from each other in the other direction which is perpendicular to the one direction.

* * * * *